United States Patent [19]

Barre

[11] Patent Number: 4,859,631
[45] Date of Patent: Aug. 22, 1989

[54] FITTING PROCESS FOR PACKAGING A SEMICONDUCTOR COMPONENT IN A PLASTIC BOX

[75] Inventor: Lucien Barre, Tours, France

[73] Assignee: Thomson-CSF, Paris, France

[21] Appl. No.: 160,169

[22] Filed: Feb. 25, 1988

Related U.S. Application Data

[62] Division of Ser. No. 775,436, Sep. 12, 1985, abandoned.

[51] Int. Cl.$^4$ .............................................. H01L 23/48
[52] U.S. Cl. ..................................... 437/209; 361/417; 174/52.1; 29/832; 357/72; 437/218
[58] Field of Search ............... 437/209, 211, 217, 219; 357/72; 174/52.2

[56] References Cited

U.S. PATENT DOCUMENTS

| | | | |
|---|---|---|---|
| 3,522,490 | 8/1970 | Kauffman | 357/72 |
| 3,569,797 | 3/1971 | Simmons | 357/72 |
| 3,628,101 | 12/1971 | Kennedy | 357/72 |
| 3,763,403 | 10/1973 | Lootens | 357/72 |
| 4,346,396 | 8/1982 | Carroll, II et al. | 357/72 |

FOREIGN PATENT DOCUMENTS

| | | | |
|---|---|---|---|
| 0048160 | 5/1981 | Japan | 357/72 |
| 0152654 | 8/1984 | Japan | 357/72 |

Primary Examiner—Brian E. Hearn
Assistant Examiner—Beverly A. Pawlikowski
Attorney, Agent, or Firm—Roland Plottel

[57] ABSTRACT

The invention relates to the encapsulation of a semin-conductor component in a plastic box.

The fitting assembly comprises a radiator plate, a ceramic plate, a copper counter-electrode, a semiconductor pellet, a connecting pin with its end bent back and welded to the counter-electrode, whereby the latter is much larger than the pellet and occupies almost the entire surface of the ceramic plate. The ends of the other connecitng pins are bent back above the metallized zones of the upper pellet surface. Fiting takes place in a positioner machined in the form of successive cups with decreasing dimensions, in order to produce a welded stack having all the above elements, except the connecting pins, which are subsequently welded to the stack once the latter has been extracted from the positioner.

16 Claims, 3 Drawing Sheets

FIG_1
PRIOR ART
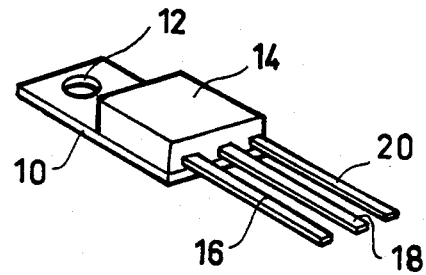
FIG_2
PRIOR ART
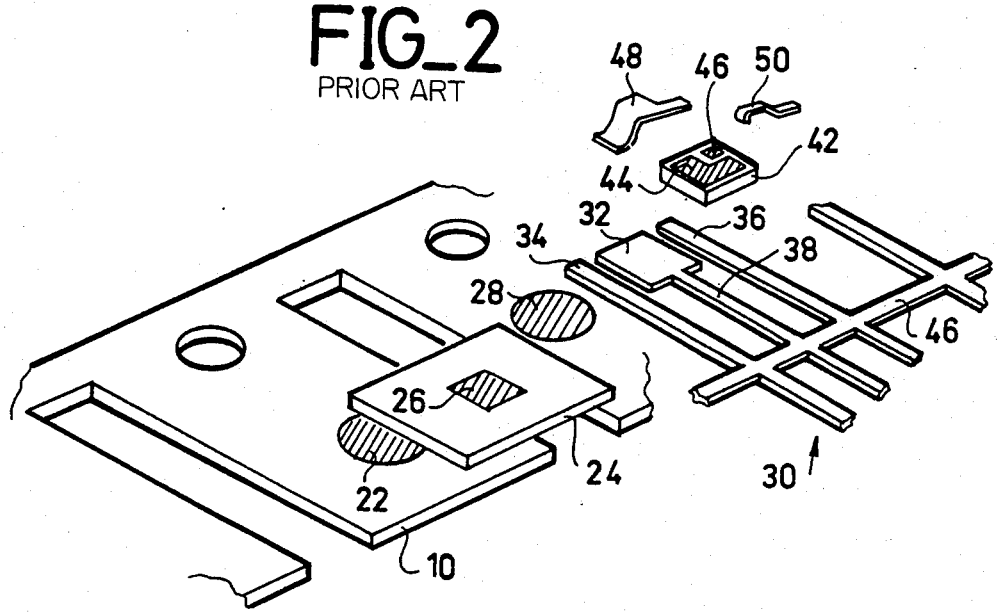

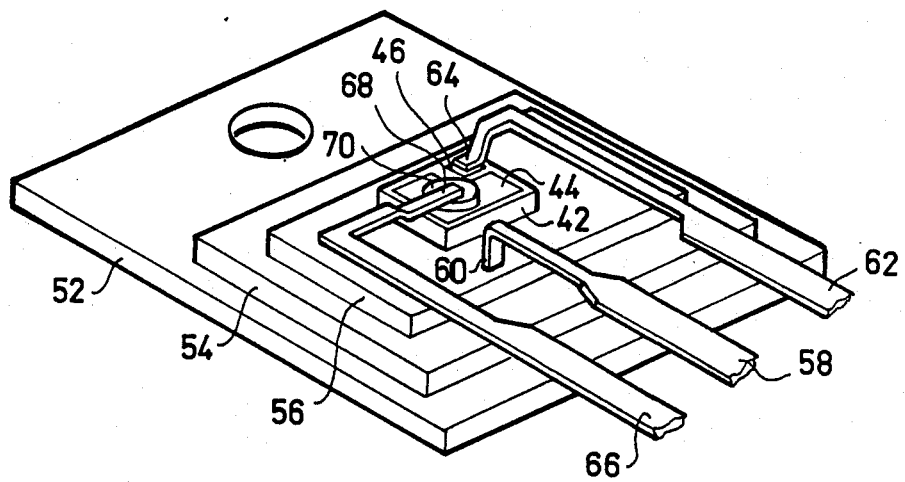
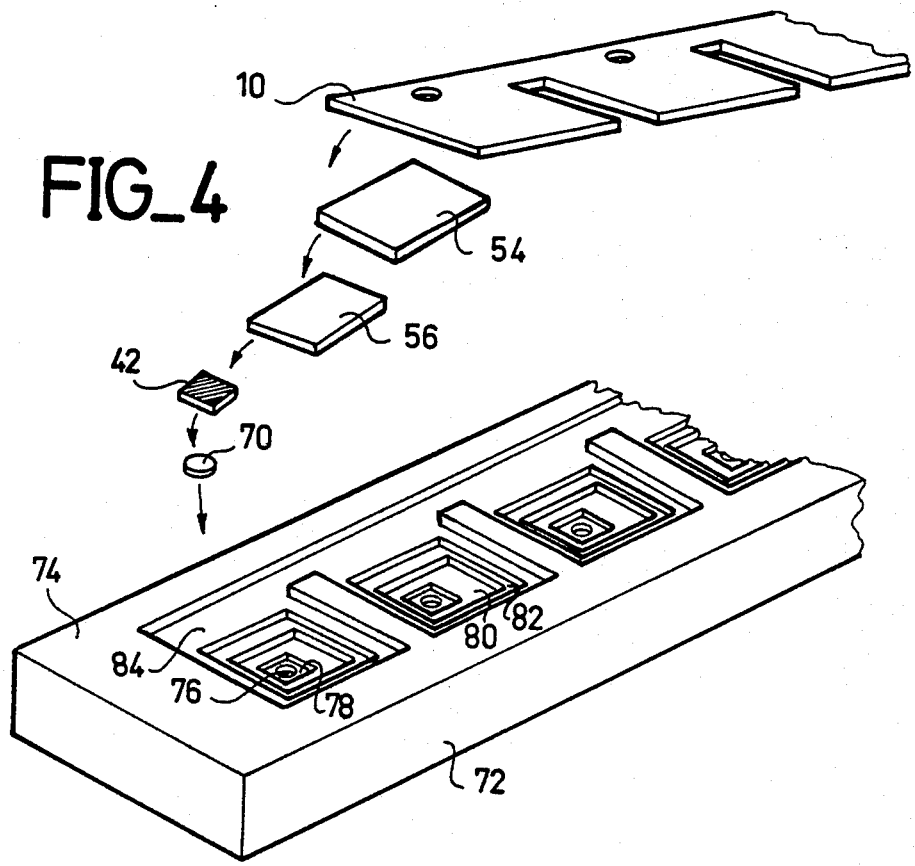

FIG_5
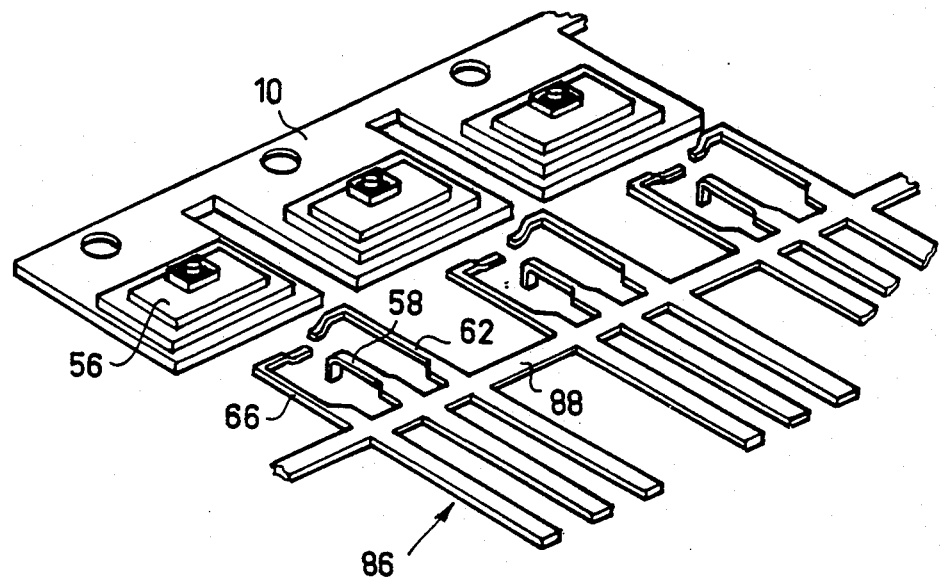
FIG_6
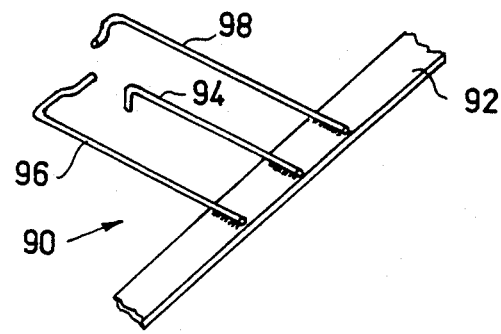

FITTING PROCESS FOR PACKAGING A SEMICONDUCTOR COMPONENT IN A PLASTIC BOX

This application is a division, of application Ser. No. 775,436, filed 9/12/85, abandoned.

BACKGROUND OF THE INVENTION

The present invention relates to the manufacture of discrete or integrated semiconductor components and particularly to the fitting thereof within a plastic box.

The invention relates to (assemblies) in a plastic box privided with a planar metal plate forming a heat radiator and provided with connecting pins projecting from the box, the assembly incorporating, within said box, the stacking on the plate forming the radiator of a ceramic plate, a metallic counter-electrode, a semiconductor chip having a rear face in electrical contact with the counter-electrode and a front face having at least one metallized zone, one of the connecting pins electrically being connected to the counter-electrode and at least one other pin being electrically connected to the metallized zone of the front face of the pellet.

This definition of a type of fitting is given in general terms and does not exclude numerous variants particularly the interposing of other metal sheets or plates between the aforementioned elements, e.g. a supplementary counter-electrode between a metallized zone of the front face of the semiconductor pellet and the connecting pin to be electrically connected to said zone.

A fitting of this type is generally known under the name "TO 220 case", whose general appearance is shown in FIG. 1 and which is conventionally used for the fitting of thyristors, transistors or triacs having a medium power level. On this figure, it is possible to see that metal plate 10 forming the radiator with a circular opening 12 for fixing by screws to a larger radiator, the plastic box 14 covering the fitting elements, but leaving free a rear face and part of the front face of the plate forming the radiator and finally three connecting pins 16, 18, 20 projecting from the box essentially in a plane parallel to the plane of plate 10.

This type of fitting is presently carried out by the applicant company in the following way (cf. FIG. 2, which shows the elements prior to assembly). The starting object is a planar radiator plate 10 having locations for several components. This plate will subsequently be cut into individual components. The following elements are successively stacked on the plate 10 for each component: a welding sheet (preform) 22, a ceramic plate 24 which is nickel-coated in its centre 26 on both faces, another welding preform 28, a lead frame 30, which is a metal tape cut so as to form both a counter-electrode 32 and connecting pins 34, 36 and 38, pin 38 being used as the connecting pin connected to counter-electrode 32. The connecting pins are joined to one another and are also joined to pins of other components simultaneously fitted to the same radiator plate in the lead frame 30. This lead frame 30 will subsequently be cut in order to individualise the different pins. The semiconductor chip 42 to be encapsulated is then placed on the stack, by placing its lead solder-coated metallized rear face in contact with counter-electrode 32. The front face of the chip has two metallized zones 44, 46 visible in FIG. 2, e.g. a cathode contact zone and a gate contact zone for a thyristor, said zones also being coated with lead solder. Finally, two conductive bridges 48, 50 are fitted, so that each of then is in contact both with a metallized zone and a respective connecting pin 34, 36.

During this fitting and up to the welding of the thus stacked elements, the welding flux between the different parts acts as a glue in order to maintain said parts in place. The assembly is then placed in a welding furnace (at approximately 320° C.) after which the welded assembly is placed in a mold and coated with thermosetting resin, whilst leaving bare the rear face of the plate forming the radiator. The connecting pins are then separated from one another by cutting and finally the radiator plate is cut up to form the individual components.

Detailed analysis of this fitting process reveals the existence of several disadvantages relating to the actual fitting process and to the component resulting therefrom.

Firstly, the stacking of most of the elements takes place manually, although the positioning thereof is difficult. Sometimes the connecting grid is mechanically positioned with respect to the radiator plate, but this is not the case with the other elements. In particular, it would be very difficult to envisage an automatic positioning of bridges 48 and 50 between the metallized zones and the connecting pins. Thus, the production efficiency is reduced by positioning defects.

When the elements are stacked, it is the welding flux which acts as a glue to keep the elements in their reciprocal positions to the time when they leave the welding furnace. Thus, it is necessary for said flux to be present, but it suffers from the disadvantage of rapidly dirtying the welding furnace and the means supporting the components during their passage in the furnace. Moreover, the presence of flux in the weld leads to a reduction in the quality of the latter, because the flux forms bubbles in the weld, prejudicial to the mechanical quality and the thermal conduction thereof in operation. It should also be noted that the production cost of conductive bridges is high.

Finally, the counter-electrode 32 forming an integral part of the connecting grid necessarily has a surface which is essentially limited to the surface of the semiconductor chip and this is for a number of reasons essentially linked with the fact that counter-electrode is laterally bounded by the connecting pins 34, 36 which surround it. Thus, these pins 34, 36 must be as close as possible to the corresponding metallized zones of the chip. This leads to a limitation to the thermal dissipation possibilities across the counter-electrode, the ceramic plate and the radiator plate with regard to the heat produced in operation in the pellet.

In order to generally improve the box fitting processes and the quality of the semiconductor components resulting therefrom the present invention proposes a novel encapsulated semiconductor component structure and a novel fitting process making it possible to obtain this structure.

SUMMARY OF THE INVENTION

The semiconductor component according to the invention is of the general type mentioned hereinbefore, namely it is fitted in a plastic box from which project at least two connecting pins, said box being provided with a flat metal plate forming radiator, an electrically insulating and thermally conductive ceramic plate, a metal counter-electrode, a semiconductor pellet having a rear face in electrical contact with the counter-electrode and a front face having at least one metallized zone, one of the connecting pins being electrically connected to the counter-electrode and another to the metallized zone.

According to the invention:
(a) the metal counter-electrode has a much larger surface than the semiconductor pellet,
(b) the lateral dimensions of the counter-electrode are slightly smaller than the ceramic plate,
(c) the connecting pin electrically connected to the counter-electrode has one end directly welded to the counter-electrode in a region thereof not covered by the pellet,
(d) each of the other connecting pins has an end leading above a respective metallized zone of the pellet.

According to a first variant, the pins have a rectangular cross-section and result from cutting a flat frame or grid. In another variant, they are constituted by metal wires with a circular cross-section.

The improved process for fitting components in a plastic box according to the invention is of the general type firstly consisting of forming a stack of elements which are welded together, among which there are in particular a metal plate forming a radiator, a ceramic plate, a metal counter-electrode, a semiconductor pellet having a metallized rear face and a front face having at least one metallized zone and electric connecting pins establishing an electric contact with the rear face of the pellet via the counter-electrode and with the metallized zone of the front face, followed by the coating with plastic material of the thus obtained stack.

According to the invention, the welded stack is formed in the following way:
(a) in a metal part forming a positioner, hollowed out in accordance with a configuration constituted by successive cups with lateral dimension decreasing from the outside to the inside of the parts, are successively placed the following elements, each having dimensions adapted to those of the cup in which they are placed;
 the semiconductor pellet with its front face turned towards the inside of the positioner,
 the counter-electrode,
 the ceramic plate,
 the plate forming the radiator, and between the adjacent elements is placed a welding material suitable for the welding of said adjacent elements to one another;
(b) the thus filled positioner is introduced into a welding furnace to obtain a rigid assembly;
(c) said assembly is extracted from the positioner;
(d) connecting pins are fixed to the assemblies so as to electrically connect them to the counter-electrode and to the metallized zones of the front face of the pellet.

BRIEF DESCRIPTION OF THE DRAWINGS

The invention is described in greater detail hereinafter relative to non-limitative embodiments and the attached drawings, wherein shown:

FIG. 1 already described, the outside appearance of a conventional box.

FIG. 2, already described, elements in the box of FIG. 1, prior to their assembly, when produced according to a process already used by the Applicant.

FIG. 3 prior to plastic coating, a component according to the invention.

FIG. 4 the first part of the production process according to the invention.

FIG. 5 the second part of the production process according to the invention.

FIG. 6 a variant of the connecting pins.

DETAILED DESCRIPTION OF THE INVENTION

Reference is only made to FIGS. 1 and 2 to the extent that the present invention makes it possible to obtain a component which will finally have an external appearance like that of the component of FIG. 1.

FIG. 3, which shows an embodiment of an encapsulated component according to the invention uses reference numeral 52 for the metal plate forming a radiator and similar to plate 10 in FIG. 1. Ceramic plate 54 is welded to the radiator plate 52 and is used for electrically insulating the semiconductor component and its connections from the radiator plate. However, it has a low thermal resistance, in order to permit maximum efficiency dissipation by the radiator plate of the heat dissipated by the component. The ceramic plate corresponds to plate 24 of FIG. 2.

An e.g. copper counter-electrode 56 is welded to the ceramic plate. Operationally it corresponds to counter-electrode 32 of FIG. 2, but it is not constructed in the same way. Firstly it occupies almost the entire surface of the ceramic plate (its lateral dimensions only being slightly smaller than those of the latter) and secondly it has in principle no extension beyond the ceramic plate, like that constituted by connecting pin 38 in FIG. 2. In this case counter-electrode 36 is simply a rectangular copper plate.

The semiconductor chip to be encapsulated is 42, as in FIG. 2. It has no special feature compared with those referred to hereinbefore and it can consequently also have on its front face two metallized zones 44, 46 whilst its rear face is also metallized. The pellet is welded by its rear face to counter-electrode 56.

It should be noted that the surface of chip 42 is much smaller than the surface of counter-electrode 56. The latter is a good heat conductor, which consequently can function as a heat diffuser towards a large part of the surface of the ceramic plate and not towards a limited part of the surface of the pellet, as is the case in FIG. 2. Moreover, it is possible to choose a desired thickness for counter-electrode 56 without being tied to the thickness of the connecting pins. By choosing a larger thickness, if desired, it is possible to further improve the heat dissipation.

A first connecting pin 58 serves to provide electrical access to the rear face of the pellet. This pin does not form an integral part of counter-electrode 56, but its end 60, which is optionally bent with respect to the general direction of the pin, is welded to the surface of the counter-electrode at a point where the latter is not covered by pellet 42.

In the case shown in FIG. 3, the connecting pins are flat and are produced by stamping a copper or other conductive material plate. The bending back of the end is carried out during this stamping operation, as is the possible bending back of the other pin.

A second connecting pin 62 is shown and serves as an electrical access to the metallized zone 46. Its bent back end 64 ends above said zone 46 (unlike the end of the corresponding pin 36 in FIG. 2, which leads to the vicinity of the pellet, but not above it and certainly not above the metallized zone to which access is required).

In the same way, a third connecting pin 66 gives electrical access to the metallized zone 44, its bent back end 68 leading above said zone.

Several variants are possible for producing the electrical contacts between these pins and the respective metallized zones. FIG. 3 illustrates these two variants by a different construction for pins 62 and 66, said constructions being usable independently or in combined manner as in FIG. 3. The end of pin 62 is directly welded to zone 46. The end of pin 66 is welded to a supplementary counter-electrode 70 (e.g. of copper), which is itself welded to the metallized zone 44.

The essence of the box fitting structure according to the invention is described. Obviously, it is possible to place between the aforementioned elements other elements, such as e.g. a metal plate positioned between counter-electrode 56 and the pellet, said plate having an expansion coefficient matched to that of silicon. Such additions do not modify the general structure according to the invention.

In the case of FIG. 3, the connecting pins are flat (with a rectangular cross-section), but they could also be circular, as will be indicated in connection with the production process, which has an advantage from the standpoint of sealing the plastic box at the connection outlet point, sealing being much better around circular connections.

A description will now be given of the process according to the invention for the encapsulation of a semiconductor component, so as to obtain a final component with the appearance shown in FIG. 1. Prior to coating with the plastic material, the process consists of two main phases, the first phase being explained relative to FIG. 4 and the second phase relative to FIG. 5.

The first phase consists of forming a stack of elements welded to one another, whilst the second phase consists of welding connecting pins to said stack. The following phases are of a conventional nature and will not be described: coating with a thermosetting resin, separation of the connecting pins, as well as cutting into individual components, several components are simultaneously formed on a same radiator plate.

During the first production phase, a metal part 72 forming a positioner for the various elements of the stacked assembly is used. This positioner is preferably used for simultaneously producing in juxtaposed manner several assemblies of components. The metal used is preferably the same as that forming the radiator plate 10 of the component, or at least a metal having the same heat expansion coefficient is chosen.

This positioner 72 is very precisely machined (by digitally controlled milling) and for each component to be produced has a succession of cups or cavities hollowed from an upper surface 74 of the positioner.

The cups successively rise in tiers from the surface towards the interior of the positioner. They have lateral dimensions decreasing from the surface towards the interior. Dimensions of each cup, including the height thereof, are matched to the dimensions (including the thickness) of a respective element of the assembly.

The elements received are dependent on the component to be produced. In order to obtain the component of FIG. 3, the elements described in connection therewith are stacked, remembering that stacking takes place in the opposite order to that used in the prior art (FIG. 2). The elements to be stacked are shown in the exploded view of FIG. 4, above the front face 74 of positioner 72. Following order is adapted:

the supplementary counter-electrode 70 in a cup 76 (the smallest and deepest) if such a counter-electrode has to be provided—it is possible to envisage several counter-electrodes in different cups and at the same depth level in part 72, semiconductor pellet 42 is cup 78, with its front face turned towards the inside of part 72, the pellet being oriented in an appropriate manner, bearing in mind the position of cup 76 containing counter-electrode 70, counter-electrode 56 in a cup 80, ceramic plate 54 in a cup 82, and the radiator plate in a cup 84.

In reality, cup 84 will be shaped so as to receive a radiator plate 10 for supporting several components in order to carry out a group fitting as was the case with other processes.

In principle, the cups have decreasing lateral dimensions from the surface towards the interior of the part. If in an exceptional manner this is not to be the case, e.g. due to the presence of a projecting lug, e.g. a lug on counter-electrode 56 projecting with respect to the dimensions of ceramic plate 54), it would obviously be necessary to provide a local widening of certain cups (openings to permit the passage of the lug), in such a way that the parts of the assembly can be introduced into the positioner, and the welded assembly can be removed therefrom.

Between each of these elements to be placed in a respective cup, is provided an appropriate welding material, which can be a welding coating on a part or a welding sheet (preform) placed between two parts. The solders used can be pastes and do not have to incorporate a flux.

Obviously parts other than those described hereinbefore can be incorporated into the stack provided that the succession of cups is adapted accordingly.

Positioner 72, filled with elements and stacked in cups corresponding to each component to be produced is placed in a welding furnace. When it leaves it, the multiple stack is rigidified and can be extracted from the positioner. This stack then undergoes the second essential phase of the process, which involves the welding of the connecting pins.

The radiator plate 10 carrying the welded stack is then mechanically positioned facing a lead frame 86 in FIG. 5. It is produced by stamping from a metal sheet. Unlike in the case of the frame of FIG. 2, it only has for each component connecting pins (three pins 58, 62, 66 here) connected by a support frame 88, but no counter-electrode like 32 in FIG. 2. Moreover, the pins are shaped and positioned corresponding to that defined relative to FIG. 3, i.e. when the lead frame is placed facing radiator plate 10, the bent back end 60 of pin 58 passes above the uncovered part of counter-electrode 56, the bent back end 64 of pin 62 passes above a metallized zone 46 to be contacted on the pellet and the bent back end 68 of pin 66 passes over another metallized zone or above the supplementary counter-electrode 70, if the latter is provided.

The pins are then welded in the following way. An optimum quantity of paste solder is deposited at precise locations where an electrical connection is to take place (the melting temperature being below that of the preceding operation, e.g. 180° to 230° C.). These paste deposits can be made e.g. by means of an automatic digitally controlled dispenser, frame 86 then being positioned on the preceding subassembly. The assembly is passed through a furnace for melting the paste. The device is then ready for encapsulation in the same way as in the prior art processes.

In a variant, in place of using a lead frame 86 cut from a metal sheet, use is made of an assembly 90 connecting wires with a circular cross-section and as shown in FIG. 6. These wires 94, 96, 98 are fixed by welding or bonding to a support band or frame 92 and each of the wires has a straight part for constituting the actual connecting pin passing out of the box and a bent back part shaped in the same way as the pin ends of frame 86, so as to pass above counter-electrode 56 and the metallized zones to be contacted on the semiconductor pellet. Following the welding of these wires to the bent back assembly and before or after coating them in a plastic material, it is merely necessary to cut the wires to separate them from the support band 92. This coupling takes place at the other end of the pins, i.e. remote from the finished box.

What is claimed is:

1. A process for fitting in a plastic box of a semiconductor component, involving the formation of a stack of elements welded to one another, including a metal plate forming a radiator, a ceramic plate, a metal counter-electrode of a semiconductor pellet having a metallized rear face and a front face having at least one metallized zone, the installation of the connecting pins establishing an electric contact with the rear face of the pellet via the counter-electrode and with the metallized zone of the front face of the pellet and finally coating said stack with a plastic material, wherein
    (a) in a metal part forming a positioner, hollowed out in accordance with a configuration constituted by successive cups with lateral dimension decreasing from the outside to the inside of the parts, are successively placed the following elements, each having dimensions adapted to those of the cup in which they are placed;
        the semiconductor pellet with its front face turned towards the inside of the positioner,
        the counter-electrode,
        the ceramic plate,
        the plate forming the radiator, and between the adjacent elements is placed a welding material suitable for the welding of said adjacent elements to one another;
    (b) the thus filled positioner is introduced into a welding furnace to obtain a rigid assembly;
    (c) said assembly is extracted from the positioner;
    (d) connecting pins are fixed to the assemblies so as to electrically connect them to the counter-electrode and to the metallized zones of the front face of the pellet.

2. A fitting process according to claim 1, wherein the end of one connecting pin is directly welded to the counter-electrode on a zone thereof not covered by the pellet.

3. A fitting process according to claims 1, wherein the end of a connecting pin is directly welded to a metallized zone of the front face of the pellet.

4. A fitting process according to claim 3, wherein the positioner is machined so as to include a cup for receiving a second counter-electrode to be welded to a metallized zone of the front face of the semiconductor pellet, wherein the fitting of various elements in the positioner involves the positioning of said second counter-electrode in front of the pellet and wherein the end of a connecting pin is welded to said second counter-electrode.

5. A fitting process according to claims 1, wherein the positioner has several groups of cups, e.g. corresponding to one of an individual component, cups for receiving the metal radiator plate being interconnected, the radiator plate being constituted by a single part for several components, said part being cut after fitting in order to separate components into individual elements.

6. A fitting process according to claims 1, wherein the connecting pins are wires having a circular cross-section.

7. A process for fabricating a semiconductor component comprised of a stack of generally planar elements welded to one another and superposed with successively decreasing lateral dimensions, including at least a metal plate forming a radiator, an electrically insulating ceramic plate, a metal counter-electrode and a semiconductor chip having a metallized rear face for welding to the metal counter-electrode and a front face having at least one metallized zone, the semiconductor component further including a first connecting pin in electrical contact with the metal counter-electrode and at least one second connecting pin in electrical contact with a respective metallized zone, said process comprising the steps of:
    (a) providing a thick metal plate forming a positioner, having a cavity tiered in an upper face, complementary to the stack of planar elements and in inverted relationship thereto;
    (b) placing into said cavity in succession with front face down said semiconductor chip, said counter-electrode, said ceramic plate and said radiator forming metal plate thereby forming a stack, a welding material being interposed between superposed adjacent elements of the stack; successively decreasing lateral dimensions, including at least a metal plate forming a radiator, an electrically insulating ceramic plate, a metal counter-electrode and a semiconductor chip having a metallized rear face for welding to the metal counter-electrode and a front face having at least one metallized zone, the semiconductor component further including a first connecting pin in electrical contact with the metal counter-electrode and at least one second connecting pin in electrical contact with a respective metallized zone, said process comprising the steps of:
    (a) providing a single metal radiator plate having a plurality of interconnected portions each defining one of said radiator forming metal plate;
    (b) providing a thick metal plate forming a positioner, having a plurality of cavities tiered in an upper face, each of said cavities being complementary to the stack of planar elements and in inverted relationship thereto, said plurality of tiered cavities being arranged so as to receive a respective interconnected portion defining one of said radiator forming metal plate;
    (c) placing into each of said cavities in succession with front face down said semiconductor chip, said counter-electrode, and said ceramic plate, and then placing each interconnected portion defining one of said radiator forming metal plate into a respective tiered cavity thereby forming a plurality of stacks, a welding material being interposed between superposed adjacent elements;
    (d) introducing said positioner containing said plurality of stacks into a welding furnace so as to melt said welding material, thereby obtaining a plurality of welded stacks;
(e) extracting said plurality of welded stacks from the positioner;
(c) introducing said positioner containing said stack into a welding furnace so as to melt said welding material, thereby obtaining a welded stack;
(d) extracting said welded stack from the positioner;
(e) fixing the first connecting pin to said counter-electrode and the at least one second connecting pin to said at least one metallized zone.

8. A process according to claim 7, further comprising the step of encapsulating the semiconductor element with a plastic resin, so that a rear face and a portion of front face of said radiator forming metal plate are exposed and said connecting pins extend outwardly of said encapsulated semiconductor component.

9. A process according to claim 7, wherein said semiconductor chip covers only a portion of the front face of said metal counter-electrode, so as to permit welding said first connecting pin to said counter-electrode front face.

10. A process according to claim 7, wherein an end of said at least one second connecting pin is directly welded to said respective metallized zone of the front face of the chip.

11. A process according to claim 7, the semiconductor component further comprising a second counter-electrode welded to a metallized zone of the front face of the chip, the metal positioner cavity having a lowermost portion complementary to said second counter-electrode, wherein said counter-electrode is placed in the lowermost portion of said cavity prior to introducing said chip, and directly welding an end of a respective second connecting pin to said second counter-electrode after the extracting step (d).

12. A process for fabricating a plurality of semiconductor components, each of said semiconductor components being comprised of a stack of generally planar elements welded to one another and superposed with (f) fixing first connecting pin to said counter-electrode and the at least one second connecting pin to said at least one metallized zone, in each of said plurality of welded stacks;
(g) severing the interconnected portions of said radiator plate from one another to separate said radiator from one another and thereby said semiconductor components.

13. A process according to claim 12, further comprising the step of encapsulating each of said plurality of semiconductor components with a plastic resin, so that a rear face and a portion of front face of said radiator forming metal plate are exposed, and said connecting pins extend outwardly of said encapsulated semiconductor component.

14. A process according to claim 12, wherein said semiconductor chip covers only a portion of the front face of said metal counter-electrode, so as to permit welding said first connecting pin to said counter-electrode front face.

15. A process according to claim 12, wherein an end of said at least one second connecting pin is directly welded to said respective metallized zone of the front face of the chip.

16. A process according to claim 12, each of the plurality of semiconductor components further comprising a second counter-electrode welded to a metallized zone of the front face of the chip, each of the plurality of metal positioner cavities having a lowermost portion complementary to said second counter-electrode, wherein said second counter-electrode is placed in the lowermost portion of said cavity prior to introducing said clip, and directly welding an end of a respective second connecting pin to said second counter-electrode after the extracting step (c).

* * * * *